US009588156B2

(12) United States Patent
Glavic et al.

(10) Patent No.: US 9,588,156 B2
(45) Date of Patent: *Mar. 7, 2017

(54) MONITORING VOLTAGE STABILITY OF A TRANSMISSION CORRIDOR

(71) Applicant: Quanta Technology, LLC, Raleigh, NC (US)

(72) Inventors: Mevludin Glavic, Tuzla (BA); Vahid Madani, Crockett, CA (US); Damir Novosel, Raleigh, NC (US)

(73) Assignee: Quanta Technology, LLC, Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/050,570

(22) Filed: Feb. 23, 2016

(65) Prior Publication Data

US 2016/0169946 A1    Jun. 16, 2016

Related U.S. Application Data

(63) Continuation of application No. 14/281,336, filed on May 19, 2014, now Pat. No. 9,291,655, which is a (Continued)

(51) Int. Cl.
    *G01R 19/25* (2006.01)
    *H02J 3/00* (2006.01)
    *G01R 27/16* (2006.01)

(52) U.S. Cl.
    CPC ......... *G01R 19/2513* (2013.01); *G01R 27/16* (2013.01); *H02J 3/00* (2013.01)

(58) Field of Classification Search
    CPC .................................................. G01R 27/16
    (Continued)

(56) References Cited

U.S. PATENT DOCUMENTS 6,219,591 B1    4/2001    Vu et al.
6,249,719 B1    6/2001    Vu et al.
(Continued)

OTHER PUBLICATIONS

Glavic, M. et al., "Real-Time Voltage Control Under Stressed Conditions; See It Fast to Keep Calm", IEEE Power & Energy Magazine, Jul.-Aug. 2012, pp. 43-55.
(Continued)

*Primary Examiner* — Jermele M Hollington
*Assistant Examiner* — Zannatul Ferdous
(74) *Attorney, Agent, or Firm* — Coats & Bennett, PLLC

(57) ABSTRACT

A voltage stability monitoring apparatus monitors the voltage stability of a transmission corridor through which power flows between different parts of a power system. The apparatus monitors an equivalent load impedance at an interface between the transmission corridor and a part of the power system designated as generating the power. This equivalent load impedance at the interface comprises a ratio of a voltage phasor at the interface to a current phasor at the interface. The apparatus tracks a Thevenin equivalent voltage and impedance of the designated part by separately updating that voltage and impedance. Notably, the apparatus updates the imaginary part of the Thevenin equivalent voltage to reflect the magnitude of any changes in the voltage phasor that are associated with large variations in the magnitude of the equivalent load impedance at the interface. The apparatus computes an index indicating the voltage stability as a function of this tracked Thevenin equivalent voltage and impedance.

26 Claims, 13 Drawing Sheets

Related U.S. Application Data continuation-in-part of application No. 14/071,167, filed on Nov. 4, 2013.

(60) Provisional application No. 61/825,121, filed on May 20, 2013.

(58) Field of Classification Search
USPC .................. 324/525, 522; 702/57, 64, 65
See application file for complete search history.

(56) References Cited

U.S. PATENT DOCUMENTS

| | | | |
|---|---|---|---|
| 7,200,500 B2 | 4/2007 | Larsson et al. | |
| 7,603,203 B2 | 10/2009 | Zhang et al. | |
| 9,291,655 B2* | 3/2016 | Glavic | G01R 27/16 |
| 2009/0009349 A1* | 1/2009 | Wiszniewski | H02J 3/24 |
| | | | 340/635 |
| 2013/0066480 A1 | 3/2013 | Glavic et al. | |
| 2014/0340102 A1* | 11/2014 | Glavic | H02J 3/24 |
| | | | 324/704 |

OTHER PUBLICATIONS

Madani, V. et al., "IEEE PSRC Report on Global Industry Experiences With System Integrity Protection Schemes (SIPS)", IEEE Transactions on Power Delivery, Oct. 2010, pp. 2143-2155, vol. 25, No. 4.

Taylor, C., "Chapter 1: General Aspects of Electric Power Systems" and "Chapter 2: What is Voltage Stability", Power System Voltage Stability, 1994, pp. 1-40, McGraw-Hill, Inc.

Van Cutsem, T. et al., "Chapter 1: Introduction", "Chapter 2: Transmission System Aspects" and "Chapter 3: Generation Aspects", Voltage Stability of Electric Power Systems, 2008, pp. 4-48, Springer-Science + Business Media, LLC.

Vu, K. et al., "Use of Local Measurements to Estimate Voltage-Stability Margin", IEEE Transactions on Power Systems, Aug. 1999, pp. 1029-1035, vol. 14, No. 3.

Larsson, M. et al., "Real-Time Voltage Stability Assessment of Transmission Corridors", Proceedings of IFAC Power Plants and Power Systems Control Conference, 2003, pp. 1-6, Seoul, Korea.

Corsi, S. et al., "A Real-Time Voltage Instability Identification Algorithm Based on Local Phasor Measurements", IEEE Transactions on Power Systems, Aug. 2008, pp. 1271-1279, vol. 23, No. 3.

Glavic, M. et al., "A Simple Computation and Visualization of Voltage Stability Power Margins in Real-Time", IEEE, 2012, pp. 1-7.

Goh, H., et al., "Dynamic Estimation of Power System Stability in Different Kalman Filter Implementations", Proceedings of the 2014 IEEE NW Russia Young Researchers in Electrical and Electronic Engineering Conference (ElConRusNW), Feb. 3, 2014, pp. 41-46, IEEE.

\* cited by examiner

MONITORING VOLTAGE STABILITY OF A TRANSMISSION CORRIDOR

RELATED APPLICATIONS

The present application is a continuation of U.S. patent application Ser. No. 14/281,336, filed May 19, 2014, which application is a continuation-in-part of U.S. patent application Ser. No. 14/071,167, filed Nov. 4, 2013, which claims the benefit of U.S. Provisional Application No. 61/825,121, filed May 20, 2013, the disclosures of which are incorporated herein by reference in their entirety.

TECHNICAL FIELD

The present invention relates generally to monitoring the voltage stability of a transmission corridor through which power flows between different parts of a power system, and in particular relates to computing an index indicating such voltage stability.

BACKGROUND

A power system generates electric power at one part of the system and transmits that power via a transmission corridor for use by another part of the system. The transmission corridor is considered to be stable in terms of voltage if the corridor maintains steady acceptable voltages not only under normal operating conditions but also after a disturbance to the system (e.g., a line outage). A voltage stable corridor therefore regains acceptable voltages after a disturbance, rather than oscillating or monotonically decreasing even in response to attempted voltage restoration mechanisms.

Transmission corridor voltage instability causes power blackouts and therefore has huge economic and societal costs. Known approaches to preventing blackouts monitor the corridor's real-time proximity to voltage instability and take appropriate control and protective actions as needed to mitigate system degradation or disturbance propagation. For example, such actions may include load shedding.

Many of these known approaches exploit the relation of the corridor's voltage instability to the power system's maximum loadability. In particular, the approaches identify the corridor's voltage instability as being strongly related to the inability of the combined generation and transmission parts of the system to provide the power requested by the receiving (i.e., load) part of the system. The approaches therefore employ a voltage instability criterion expressed directly or indirectly in terms of the system's maximum deliverable power, which is reached when the magnitude of the Thevenin equivalent impedance of the combined generation and transmission parts of the system equals the magnitude of the equivalent load impedance of the power receiving part: $|Z_{Th}|=|Z_l|$.

At least some of these approaches estimate the Thevenin equivalent impedance of the combined generation and transmission parts of the system in stages. Such multi-stage approaches involve estimating the power generating part's Thevenin equivalent. Some known techniques for "estimating" the power generating part's Thevenin equivalent simply assume that either the Thevenin equivalent voltage or impedance of the power generating part is known. See U.S. Pat. No. 7,200,500 B2, April 2007, which is incorporated by reference herein in its entirety. Other techniques actually identify (i.e., track) the power generating part's Thevenin equivalent in the interest of accuracy, i.e., without making the above assumption. One such tracking technique performs recursive least squares using voltage and current phasor measurements taken at an interface between the power generating part and the transmission corridor. See U.S. Pat. No. 6,219,591 B1, which is incorporated by reference herein in its entirety. To avoid delays associated with the recursive least squares technique, an alternative tracking technique separately updates the power generating part's Thevenin equivalent voltage and impedance. S. Corsi and G. N. Taranto, "A real-time voltage instability identification algorithm based on local phasor measurements," IEEE Trans. Power Syst., vol. 23, no. 3, pp. 1271-1279, August 2008.

SUMMARY

One or more embodiments herein track the Thevenin equivalent of a power generating part of a power system with improved accuracy as compared to known tracking techniques. This improved accuracy advantageously prevents or at least mitigates false alarms in terms of prematurely detecting transmission corridor voltage instability.

More particularly, embodiments herein include a method of monitoring voltage stability of a transmission corridor through which power flows between different parts of a power system. The method is implemented by a voltage stability monitoring apparatus. The method includes monitoring an equivalent load impedance at an interface between the transmission corridor and a part of the power system designated as generating the power. The equivalent load impedance at this "power generating part" interface comprises a ratio of a voltage phasor at the interface to a current phasor at the interface.

The method further includes tracking a Thevenin equivalent voltage and impedance of the designated part by separately updating that voltage and impedance. Updating the Thevenin equivalent voltage in this regard comprises updating the voltage to reflect the magnitude of any changes in the voltage phasor that are associated with large variations in the magnitude of the equivalent load impedance at the power generating part interface. Such large variations include variations greater than a threshold-defined variation.

The method finally includes computing an index indicating the voltage stability as a function of the tracked Thevenin equivalent voltage and impedance.

In at least some embodiments, updating the Thevenin equivalent voltage comprises, for each of a plurality of phasor measurement times, determining whether or not variation in the magnitude of the equivalent load impedance at the power generating part interface since a previous phasor measurement time is greater than the threshold-defined variation. If so, the method comprises adjusting the Thevenin equivalent voltage computed for the previous phasor measurement time by the magnitude of the change in the voltage phasor since that previous phasor measurement time.

Thevenin equivalent voltage in some embodiments is also updated responsive to small variations in the magnitude of the equivalent load impedance at the power generating part interface. Specifically, the Thevenin equivalent voltage is decreased or increased by a predefined percentage change when those small variations do or do not have the same polarity as variations in the Thevenin equivalent impedance, respectively. Such small variations include variations less than the threshold-defined variation.

In some embodiments, updating the Thevenin equivalent voltage comprises updating the Thevenin equivalent voltage's complex value in rectangular coordinates. Alternatively or additionally, the method includes dynamically adjusting a threshold defining the threshold-defined variation, as a function of the Thevenin equivalent voltage.

Additionally, in one or more embodiments, updating the Thevenin equivalent impedance comprises solving a set of two linear equations with two unknown variables. These two unknown variables comprise the real and imaginary parts of the Thevenin equivalent impedance. Known variables in the set of two linear equations include the real and imaginary parts of the Thevenin equivalent voltage, as updated to reflect the magnitude of any changes in the voltage phasor at the power generating part interface.

Still further, the method in some embodiments entails dynamically adapting which part of the power system is designated as generating the power. Such dynamic adaptation is performed responsive to detecting a change in direction or magnitude of power flowing through one or both interfaces between the transmission corridor and the parts of the power system.

Finally, in one or more embodiments, the method involves monitoring whether a breaker for each line associated with the power generating part interface is open or closed. In this case, monitoring the equivalent load impedance at that interface comprises dynamically computing the equivalent load impedance at the interface exclusively from phasor measurements taken at lines whose breakers are closed. In some of these embodiments, responsive to detecting the opening or closing of one or more of these breakers, the method entails updating the Thevenin equivalent voltage to reflect the magnitude of the resulting change in the voltage phasor, as dynamically computed, without re-initializing the Thevenin equivalent voltage.

Embodiments herein further include a voltage stability monitoring apparatus configured to perform the above-described method.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
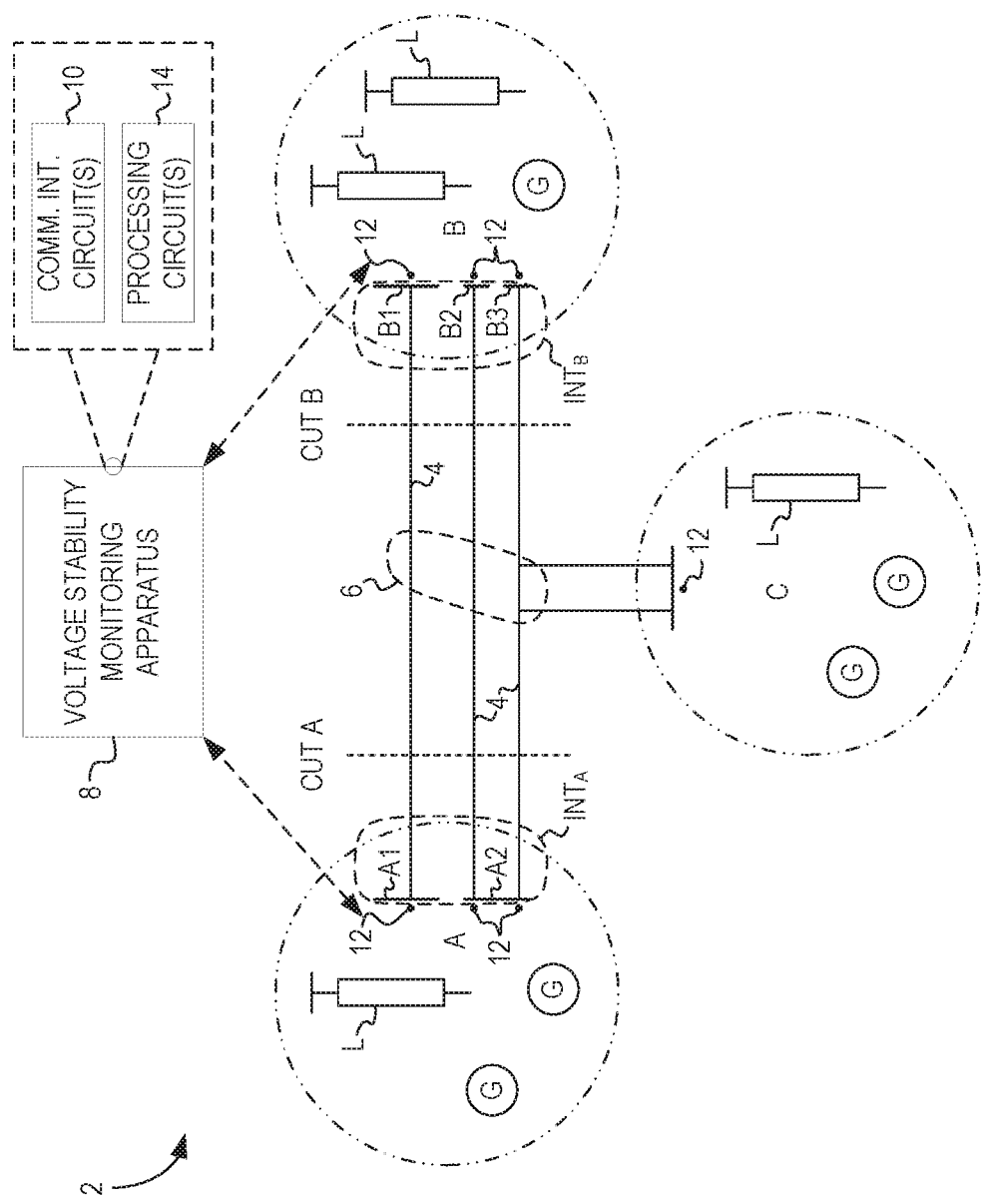
FIG. 1 is a block diagram of a power system and a voltage stability monitoring apparatus according to one or more embodiments.

FIG. 1 illustrates a power system 2 according to one or more embodiments. The power system 2 generates electric power at one part of the system 2 and transmits that power via one or more transmission lines 4 for use by another part of the system 2. As shown, for example, parts A, B, and C of the power system 2 are each characterized by some degree of power generation (G) and loading (L). But power in the aggregate flows in a direction from part A towards part B via the one or more transmission lines 4. Regardless of the actual power flow direction, though, such characterization of the power system 2 into different parts effectively means that different transfer cuts A and B define a (virtual) transmission corridor 6 between those parts.

The transmission corridor 6 is composed of the one or more physical transmission lines 4 via which power flows between the power system parts. FIG. 1 shows these transmission lines 4 interface parts A and B of the power system 2 at physical buses A1-A2 and B1-B3. This means that the corridor 6 interfaces parts A and B at interfaces $Int_A$ and $Int_B$. As shown, interface $Int_A$ is a virtual bus comprising a group of physical buses A1-A2. Likewise, interface $Int_B$ as shown is a virtual bus comprising a group of physical buses B1-B3.

The transmission corridor 6 is considered to be stable in terms of voltage if the corridor 6 maintains steady acceptable voltages not only under normal operating conditions but also after a disturbance to the system 2 (e.g., a line outage). A voltage stable corridor therefore regains acceptable voltages after a disturbance, rather than oscillating or monotonically decreasing even in response to attempted voltage restoration mechanisms.

A voltage stability monitoring apparatus 8 is configured to monitor the voltage stability of the transmission corridor 6, in order to detect in real-time the proximity of the corridor 6 to voltage instability. The apparatus 8 in this regard comprises one or more communication interface circuits 10 configured to communicatively couple the apparatus 8 to a plurality of time synchronized phasor measurement units (PMUs) 12 deployed at both ends of the corridor 6. Any given PMU 8 deployed at an interface between the corridor 6 and a part of the system 2 measures a voltage phasor and/or a current phasor locally at that interface, and communicates those phasor measurements to the apparatus 8 (e.g., at a rate of 10-120 samples per second). For example, PMUs 12 deployed at $Int_A$ measure voltage phasors at and current phasors in transmission lines 4 associated with physical buses A1-A2.

The voltage stability monitoring apparatus 8 also comprises one or more processing circuits 14 configured to use the received phasor measurements to compute an index indicating the corridor's voltage stability. The one or more processing circuits 14 do so according to the processing 100 illustrated in FIG. 2.

Figure 2:
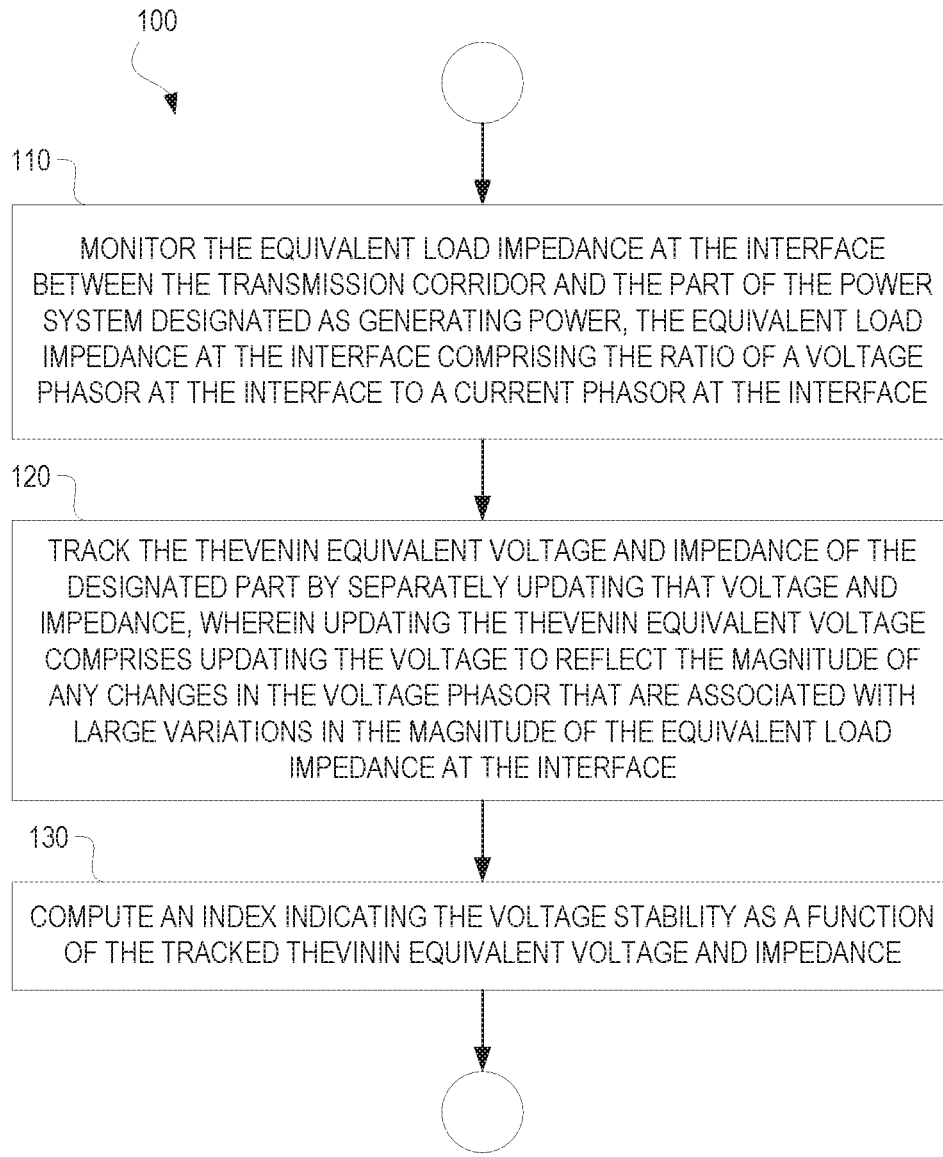
FIG. 2 is a logic flow diagram of a method implemented by a voltage stability monitoring apparatus according to one or more embodiments.

As shown in FIG. 2, processing 100 by the one or more processing circuits 14 includes monitoring an equivalent load impedance at an interface $Int_g$ between the transmission corridor 6 and a part of the power system designated as generating said power (e.g., $Int_A$ in FIG. 1) (Block 110). This interface $Int_g$ is also referred to herein as the "power generating part interface" for convenience. The equivalent load impedance at this interface $Int_g$ comprises a ratio of a voltage phasor at the interface $Int_g$ to a current phasor at the interface $Int_g$. In at least some embodiments, these voltage and current phasors at the interface $Int_g$ are computed from the voltage and current phasor measurements received from the one or more PMUs 12 deployed at the one or more physical buses which collectively form that interface $Int_g$. Regardless, the equivalent load impedance at interface $Int_g$ as used herein characterizes the load "seen" by interface $Int_g$ and therefore characterizes both the transmission corridor 6 and the power receiving part of the system 2.

Processing 100 by the one or more processing circuits 14 further includes tracking a Thevenin equivalent voltage and impedance of the designated power generating part, by separately updating that voltage and impedance (Block 120). As used herein, separately updating the Thevenin equivalent voltage and impedance means updating the Thevenin equivalent voltage separately from updating the Thevenin equivalent impedance, rather than jointly updating both the voltage and impedance by simultaneously solving for them. Notably, updating the Thevenin equivalent voltage comprises updating the voltage to reflect the magnitude of any changes in the voltage phasor at the interface $Int_g$ that are associated with large variations in the magnitude of the equivalent load impedance at the interface $Int_g$. Large variations in this regard include variations greater than a threshold-defined variation.

Processing 100 finally includes computing an index indicating the corridor's voltage stability as a function of the tracked Thevenin equivalent voltage and impedance (Block 130). This index as used herein comprises any indicator that quantifies the transmission corridor's proximity to voltage instability. With the corridor's voltage stability quantified in this way, actions can be taken as needed to control the corridor's stability and/or mitigate system degradation or disturbance propagation. In some embodiments, for example, processing 100 further comprises automatically performing a prescribed action based on the index. In other embodiments, processing 100 just comprises displaying the index, e.g., to system operators that initiate control and/or protective actions as they deemed appropriate.

In any event, regardless of the particular form of the index, computing the index as described advantageously prevents or at least mitigates false alarms in terms of prematurely detecting transmission corridor voltage instability. This is because the Thevenin equivalent voltage and impedance of the designated power generating part are tracked more accurately as compared to known approaches.

Indeed, rather than assigning any variation in the magnitude of the equivalent load impedance at the interface $Int_g$ to the Thevenin equivalent impedance, embodiments herein selectively assign variations in that magnitude which are deemed large to the Thevenin equivalent voltage instead. Such more accurately reflects the fact that these large variations are attributable to otherwise unmeasured changes in the designated power generating part (e.g., switching shunt capacitors on or off, generators hitting their reactive power limits, line outages, etc.), as distinguished from changes in local load.

Figure 3:
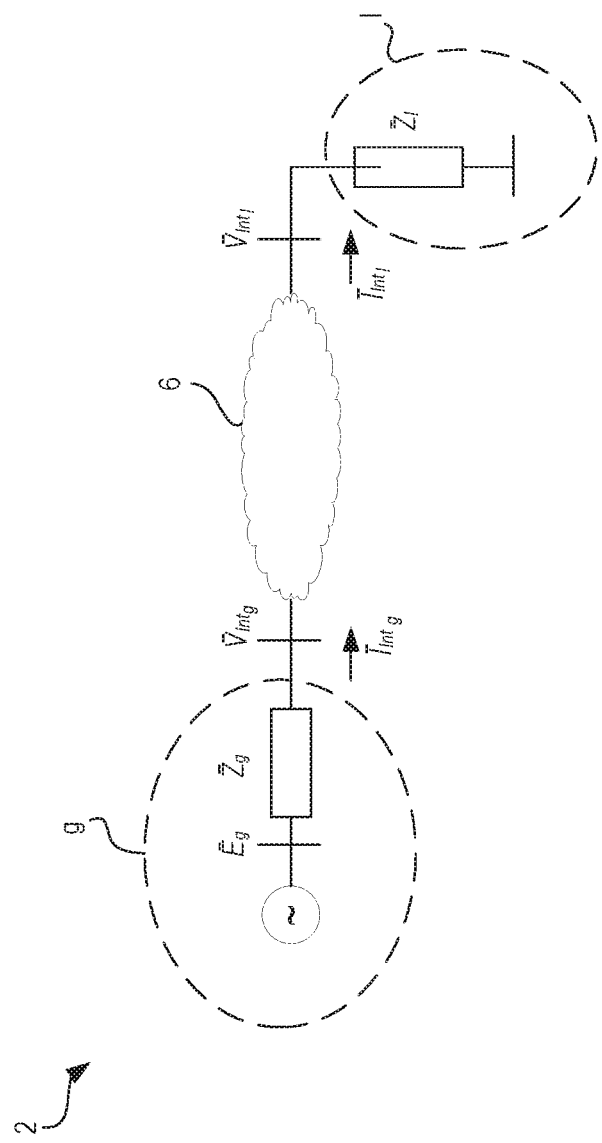
FIG. 3 is a schematic diagram of a circuit model of the power system according to one or more embodiments.

FIG. 3 illustrates additional details about how the voltage stability monitoring apparatus 8 tracks the Thevenin equivalent voltage and impedance according to one or more embodiments. As shown, the voltage stability monitoring apparatus 8 models the power system 2 as including a power generating part g (e.g., part A in FIG. 1), a power receiving (i.e., load) part/(e.g., part B in FIG. 1), and a transmission corridor 6 that interfaces part g at a power generating part interface $Int_g$ and that interfaces part/at a power receiving part interface $Int_l$. The apparatus 8 further models the power generating part g in terms of its Thevenin equivalent voltage $\overline{E}_g$ and impedance $\overline{Z}_g$, and models the power receiving part/in terms of its equivalent load impedance $\overline{Z}_l$. The apparatus 8 tracks $\overline{E}_g$ and $\overline{Z}_g$ based exclusively on a voltage phasor $\overline{V}_{Int_g}^{\,i}$ and a current phasor $\overline{I}_{Int_g}^{\,i}$ at interface $Int_g$, and tracks $\overline{Z}_l$ based exclusively on a voltage phasor $\overline{V}_{Int_l}^{\,i}$ and a current phasor $\overline{I}_{Int_l}^{\,i}$ at interface $Int_l$.

Figure 4:
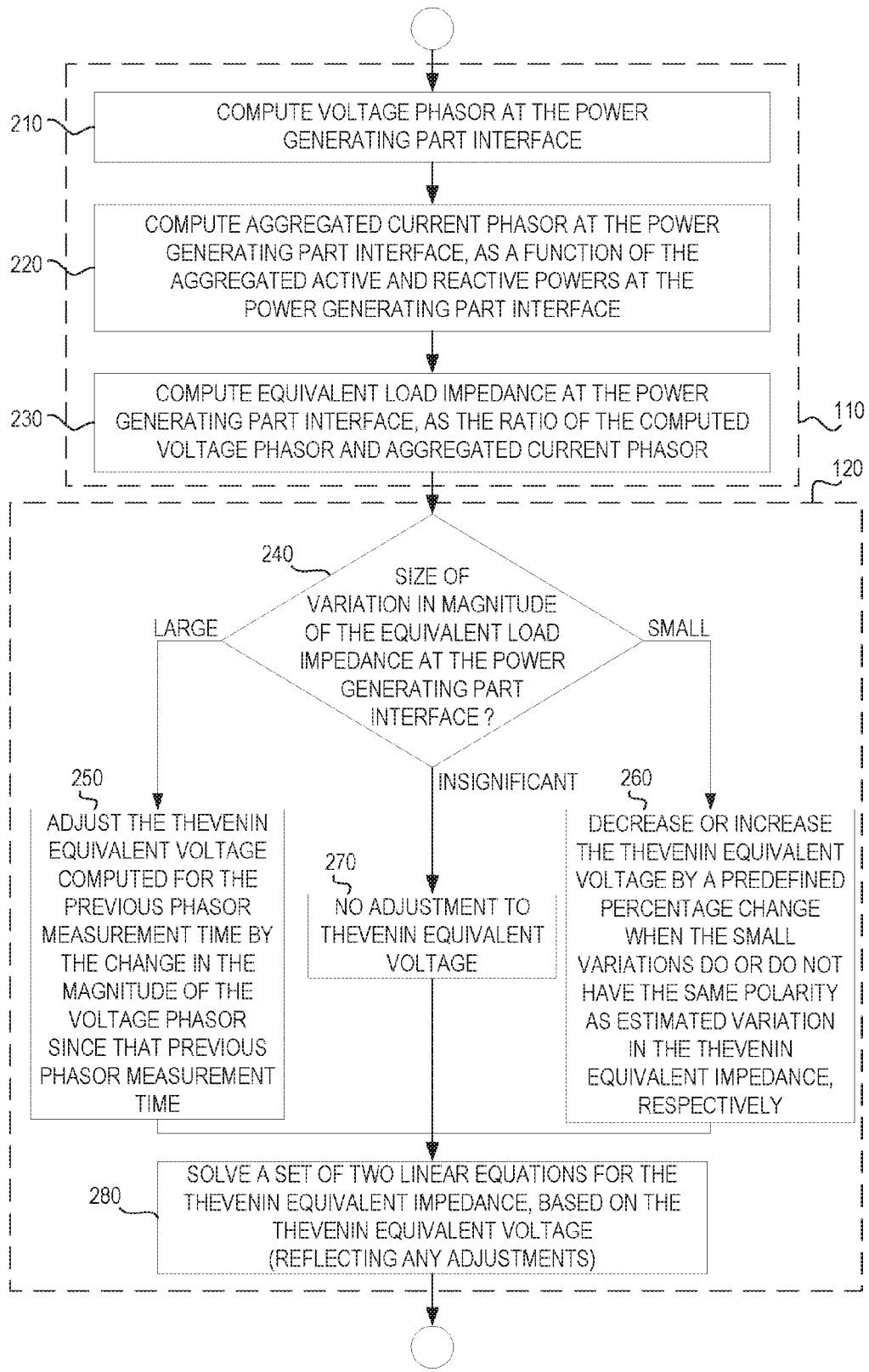
FIG. 4 is a logic flow diagram of a process for tracking the equivalent load impedance at the power generating part interface and for updating the Thevenin equivalent voltage at that interface, according to one or more embodiments.

FIG. 4 illustrates processing performed by the apparatus 8 to track $\overline{E}_g$ and $\overline{Z}_g$ in this way, according to one or more embodiments (different with respect to U.S. Pat. No. 7,200,500 B2, April 2007, which is incorporated by reference herein in its entirety). FIG. 4's processing is performed for each of a plurality of phasor measurement times i=0, 1, . . . , N; that is, for each time i a synchronized measurement sample is received from the one or more PMUs 12 deployed at interface $Int_g$. A measurement sample received from a given PMU 12 deployed at interface $Int_g$ includes voltage phasors $\overline{V}_{Int_g}^{\,i}$ measured at and current phasors $\overline{I}_{Int_g}^{\,i}$ measured in transmission lines associated with interface $Int_g$. Of course, $\overline{E}_g$ be initialized at the start of FIG. 4's processing. By considering $\overline{E}_g$ in rectangular coordinates (described by its real and imaginary parts) and taking voltage $\overline{V}_{Int_g}^{\,i}$ as reference (setting its imaginary part to zero), $\overline{E}_g$ is initialized as:

$$E_{g,R}^0 = V_{Int_g}^0 ; E_{g,I}^0 = \sqrt{\left(\frac{Z_s^0 I_{Int_g}^0 - V_{Int_g}^0}{2}\right)^2 - \left(V_{Int_g}^0\right)^2} \quad (1)$$

where $$Z_s^0 = \frac{V_{Int_g}^0}{I_{Int_g}^0},$$

R indicates real and I imaginary part of complex Thevenin voltage $\overline{E}_g$.

Regardless, as shown, the apparatus 8 computes a voltage phasor $\overline{V}_{Int_g}^{\,i}$ at interface $Int_g$ for measurement time i (Block 210). The apparatus computes $\overline{V}_{Int_g}^{\,i}$ in at least some embodiments as:

$$\bar{V}^i_{Int_g} = \frac{\sum_{c \in Int_g} P^i_c \bar{V}^i_{Int_g,c}}{\sum_{c \in Int_g} P^i_c} \quad (2)$$

where $P^i_c$ is the power transfer through transmission line c at measurement time i. The apparatus 8 also computes an aggregated current phasor $\bar{I}^i_{Int_g}$ at interface $Int_g$ for measurement time i (Block 220). In at least some embodiments, the apparatus 8 computes $\bar{I}^i_{Int_g}$ as a function of the aggregated active and reactive powers at interface $Int_g$. In this case, the apparatus 8 computes $\bar{I}^i_{Int_g}$ as:

$$\bar{I}^i_{Int_g} = \left(\frac{P^i_{Int_g} + jQ^i_{Int_g}}{\bar{V}^i_{Int_g}}\right)^* \quad (3)$$

where $$P^i_{Int_g} = \Sigma_{c \in Int_g} P^i_c \quad (4)$$

$$Q^i_{Int_g} = \Sigma_{c \in Int_g} Q^i_c \quad (5)$$

Figure 5:
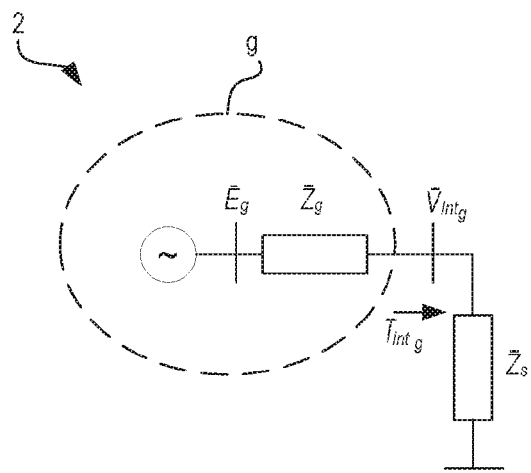
FIG. 5 is a schematic diagram of a power system circuit model which illustrates the equivalent load impedance at the power generating part interface, according to one or more embodiments.

Regardless, the apparatus 8 then computes an equivalent load impedance $\bar{Z}^i_s$ at interface $Int_g$ for measurement time i (Block 230). As modeled in FIG. 5, the equivalent load impedance $\bar{Z}_s$ is the load "seen" by interface $Int_g$ (in the direction away from the power generating part g). Accordingly, for the current measurement time i, the apparatus 8 according to one or more embodiments computes the equivalent load impedance $\bar{Z}_s$ at interface $Int_g$ as:

$$\bar{Z}^i_s = \frac{\bar{V}^i_{Int_g}}{\bar{I}^i_{Int_g}} \quad (6)$$

Having computed $\bar{Z}^i_s$, the apparatus 8 tracks $\bar{E}_g$ and $\bar{Z}_g$ by computing $\bar{E}^i_g$ and $\bar{Z}^i_g$ for the current measurement time i in different ways depending on how much the magnitude of $\bar{Z}_s$ has varied since the previous measurement time i–1. Specifically, the apparatus 8 determines the size of the variation in the magnitude of $\bar{Z}_s$, as $|\bar{Z}^i_s| - |\bar{Z}^{i-1}_s|$ (Block 240). The apparatus 8 is configured to deem the size of this variation as "large" if the size of the variation is greater than a threshold-defined variation. In at least some embodiments, this threshold-defined variation is a predefined percentage variation since the previous measurement time i–1, defined as $\epsilon_1 \times |\bar{Z}^{i-1}_s|$. As an example, the threshold $\epsilon_1$ may have a value in the range from 0.01 to 0.05. On the other hand, the apparatus 8 is configured to deem the size of the variation as "small" if the size of the variation is less than the threshold-defined variation. That said, in least some embodiments, the apparatus 8 deems particularly small variations as "insignificant" variations that do not justify updating $\bar{Z}_g$. Insignificant variations in this case are deemed to be variations that are less than a second threshold-defined variation. Such second threshold-defined variation may be a second predefined percentage variation since the previous measurement time i–1, defined as $\epsilon_2 \times |\bar{Z}^{i-1}_s|$. As an example, the threshold $\epsilon_2$ may have a value in the range from 0.00005 to 0.001.

In at least some embodiments, the apparatus 8 dynamically adjusts the threshold defining the first and/or the second threshold-defined variation, as a function of the Thevenin equivalent voltage $\bar{E}_g$. That is, the apparatus 8 dynamically adjusts $\epsilon_1$ and/or $\epsilon_2$ as a function of $\bar{E}_g$. In one embodiment, for example, the apparatus 8 dynamically decreases $\epsilon_1$ and $\epsilon_2$ responsive to increases in $\bar{E}_g$.

Irrespective of these details, if the apparatus 8 deems the size of the variation in the magnitude of $\bar{Z}_s$ as "large", the apparatus 8 adjusts imaginary part of the Thevenin equivalent voltage computed for the previous phasor measurement time (i.e., $E_{g,I}^{i-1}$) by the magnitude of the change in voltage phasor $\nabla_{Int_g}$ at interface $Int_g$ since that previous phasor measurement time (i.e., by $|\bar{V}^i_{Int_g} - \bar{V}^{i-1}_{Int_g}|$)(Block 250) (real part of the Thevenin equivalent voltage is set to $E_{g,R}^i = V^i_{Int_g}$). In at least some embodiments, the apparatus 8 updates $\bar{E}_g$ in this way by updating the complex value $\bar{E}_g$ in rectangular coordinates (real and imaginary parts), as opposed to separately updating the magnitude and angle of the complex value $\bar{E}_g$. In this case, the apparatus 8 computes imaginary part of the Thevenin equivalent voltage $E_{g,I}^i$ for the current phasor measurement time i as:

$$E_{g,I}^i = E_{g,I}^{i-1}(1 + |\bar{V}^i_{Int_g} - \bar{V}^{i-1}_{Int_g}|) \quad (7)$$

By contrast, if the apparatus 8 deems the size of the variation in the magnitude of $\bar{Z}_s$ as "small", the apparatus 8 increases or decreases imaginary part of the Thevenin equivalent voltage computed for the previous phasor measurement time (i.e., $E_{g,I}^{i-1}$) by a predefined percentage change (Block 260). In some embodiments, for instance, the predefined percentage change is $|E_{g,I}^{i-1} \times k|$, where k is a pre-specified parameter configured to constrain tracking error within predefined bounds. As an example, k may have a value in the range from 0.01 to 0.0001, with k being set as higher within this range for a certain number of initial measurement sample times (e.g., until i=100) and being set as lower within the range thereafter. Regardless, the apparatus 8 decreases $E_{g,I}^{i-1}$ by the predefined percentage change when the variation in the magnitude of $\bar{Z}_s$ (i.e., $|\bar{Z}^i_s| - |\bar{Z}^{i-1}_s|$) has the same polarity as estimated variation in the Thevenin equivalent impedance $\bar{Z}_g$ (i.e., $|\bar{Z}^{i*}_g| - |\bar{Z}^{i-1}_g|$, with $\bar{Z}^{i*}_g$ being an estimate or intermediate evaluation of $\bar{Z}^i_g$ that takes into account the present value of $\nabla_{Int_g}$ and $\bar{I}_{Int_g}$ and the previous value of $\bar{E}_g$). Conversely, the apparatus 8 increases $E_{g,I}^{i-1}$ by the predefined percentage change when $|\bar{Z}^i_s| - |\bar{Z}^{i-1}_s|$ does not have the same polarity as $|\bar{Z}^{i*}_g| - |\bar{Z}^{i-1}_g|$.

Similarly to the case for largely sized variations, the apparatus 8 in some embodiments updates $\bar{E}_g$ responsive to small sized variations by updating the complex value $\bar{E}_g$ rectangular coordinates (real and imaginary parts), thus directly providing correction for both the magnitude and angle of $\bar{E}_g$. This is contrasted with known approaches that separately update the magnitude and angle of the complex value $\bar{E}_g$. Updating the complex value $\bar{E}_g$ in rectangular coordinates advantageously allows the apparatus 8 to better track $\bar{E}_g$ in the face of dynamic changes in the system. In one or more embodiments, for instance, the apparatus 8 decreases $E_{g,I}^{i-1}$ by unconditionally computing $E_{g,I}^i$ for the current phasor measurement time i as:

$$E_{g,I}^i = E_{g,I}^{i-1}(1 - |E_{g,I}^{i-1} \times k|) \quad (8)$$

Likewise, the apparatus 8 increases $E_{g,I}^{i-1}$ by unconditionally computing $E_{g,I}^i$ for the current phasor measurement time i as:

$$E_{g,I}^i = E_{g,I}^{i-1}(1 + |E_{g,I}^{i-1} \times k|) \quad (9)$$

By updating $\bar{E}_g$ according to equations (8) and (9), the Thevenin equivalent tracking technique herein advantageously applies to cases when active and reactive power flows over the corridor 6 have opposite directions. This represents improvement over known Thevenin equivalent tracking approaches where such is not the case. For example, Corsi and Taranto's approach bound updates of $\overline{E}_g$ by a lower bound $\epsilon_{inf}$ and an upper bound $\epsilon_{sup}$. S. Corsi and G. N. Taranto, "A real-time voltage instability identification algorithm based on local phasor measurements," *IEEE Trans. Power Syst.*, vol. 23, no. 3, pp. 1271-1279, August 2008. But the lower bound $\epsilon_{inf}$ is valid only if the active and reactive power flows have the same direction. And the upper bound $\epsilon_{sup}$ is valid only at the voltage instability point (maximum deliverable power). According to one or more embodiments, therefore, decreasing $E_{g,I}^{i-1}$ by unconditionally computing $E_{g,I}^{i}$ according to equation (8) and increasing $E_{g,I}^{i-1}$ by unconditionally computing $E_{g,I}^{i}$ according to equation (9) means that the apparatus 8 does not condition the amount by which $E_{g,I}^{i-1}$ is decreased or increased on the value of Corsi and Taranto's lower and upper bounds $\epsilon_{inf}$, $\epsilon_{sup}$.

Finally, if the apparatus 8 deems the size of the variation in the magnitude of $\overline{Z}_s$ as "insignificant", the apparatus 8 does not adjust the Thevenin equivalent voltage $\overline{E}_g$ (Block 270). That is, the apparatus 8 simply computes imaginary part of the Thevenin equivalent voltage $E_{g,I}^{i}$ for the current phasor measurement time i as:

$$E_{g,I}^{i} = E_{g,I}^{i-1} \quad (10)$$

Irrespective of how the apparatus 8 updates the Thevenin equivalent voltage $\overline{E}_g$, the apparatus 8 then updates the Thevenin equivalent impedance $\overline{Z}_g$ separately; that is, rather than jointly updating $\overline{E}_g$ and $\overline{Z}_g$ for the current measurement time i by simultaneously solving for $\overline{E}_g$ and $\overline{Z}_g$, the apparatus 8 first updates $\overline{E}_g$ without updating $\overline{Z}_g$ and then updates $\overline{Z}_g$ based on the updated $\overline{E}_g$. One or more embodiments herein are indifferent to the method the Thevenin equivalent impedance $\overline{Z}_g$ is updated. In embodiments shown in FIG. 4, though, the apparatus 8 updates the Thevenin equivalent impedance $\overline{Z}_g$ by solving a set of two linear equations for $\overline{Z}_g$, based on the Thevenin equivalent voltage $\overline{E}_g$ (as updated/adjusted for the current measurement time) (Block 280). Specifically, the apparatus 8 solves:

$$y_i = H_i^T x_i \quad (11)$$

$$y_i = \begin{bmatrix} V_{Int_g,R}^i - E_{g,R}^i \\ V_{Int_g,I}^i - E_{g,I}^i \end{bmatrix} \quad (12)$$

$$x_i = \begin{bmatrix} R_g^i \\ X_g^i \end{bmatrix} \quad (13)$$

$$H_i^T = \begin{bmatrix} -I_{Int_g,R}^i & I_{Int_g,I}^i \\ -I_{Int_g,I}^i & -I_{Int_g,R}^i \end{bmatrix} \quad (14)$$

where $R_g^i + jX_g^i$ as the real and imaginary parts of $\overline{Z}_g$ are the two unknown variables for which the apparatus 8 solves the set of equations, and where $E_{g,R}^i$ and $E_{g,I}^i$ as the real and imaginary parts of $E_g^i$, $V_{Int_g,R}^i$ and $V_{Int_g,I}^i$ as the real and imaginary parts of $V_{Int_g}^i$, and $I_{Int_g,R}^i$ and $I_{Int_g,I}^i$ as the real and imaginary parts of $I_{Int_g}^i$ are known variables. Real part of the Thevenin equivalent voltage is set to $E_{g,R}^i = V_{Int_g}^i$. Computing Thevenin equivalent impedance $\overline{Z}_g$ in this way does not involve assuming that equivalent reactive is negligible. Unlike Corsi and Taranto's approach which makes this assumption, therefore, the Thevenin equivalent tracking approach herein advantageously extends to lower voltage levels where this assumption does not hold.

Updating the Thevenin equivalent voltage $\overline{E}_g$ and impedance $\overline{Z}_g$ as described above more accurately accounts for the impact that the power generating part g of the system 2 has on the stability conditions of the transmission corridor 6. Indeed, changes in such stability conditions are caused either by (A) changes in the power receiving (i.e., load) part l; or (B) changes in the power generating part g not directly measured by available measurements (e.g., switching shunt capacitors on or off, generators hitting their reactive power limits, line outages, etc.). If changes in the equivalent load impedance $\overline{Z}_l$ of the power receiving part/are only accompanied by changes in the current $\overline{I}_{Int_g}$ at the power generating part interface $Int_g$, without large changes in the voltage $\overline{V}_{Int_g}$ at that interface $Int_g$, those changes should be account for with updates to the equivalent load impedance $\overline{Z}_l$. The Thevenin equivalent voltage $\overline{E}_g$ of the power generating part g should only be updated to reflect small changes in the system 2 (i.e., according to equations (8) and (9)). The apparatus 8 detects that this scenario applies when the apparatus 8 detects relatively small variations in the magnitude of the equivalent load impedance $\overline{Z}_s$ at interface $Int_g$. On the other hand, if changes in the equivalent load impedance $\overline{Z}_l$ of the power receiving part/are accompanied by changes in the current $\overline{I}_{Int_g}$ at the power generating part interface $Int_g$, as well as by large changes in the voltage $\overline{V}_{Int_g}$ at that interface $Int_g$, those changes should be account for updates to the Thevenin equivalent voltage $\overline{E}_g$ of the power generating part g (according to equation (7)). The apparatus 8 detects that this scenario applies when the apparatus 8 detects relatively large variations in the magnitude of the equivalent load impedance $\overline{Z}_s$ at interface $Int_g$.

Figure 6:
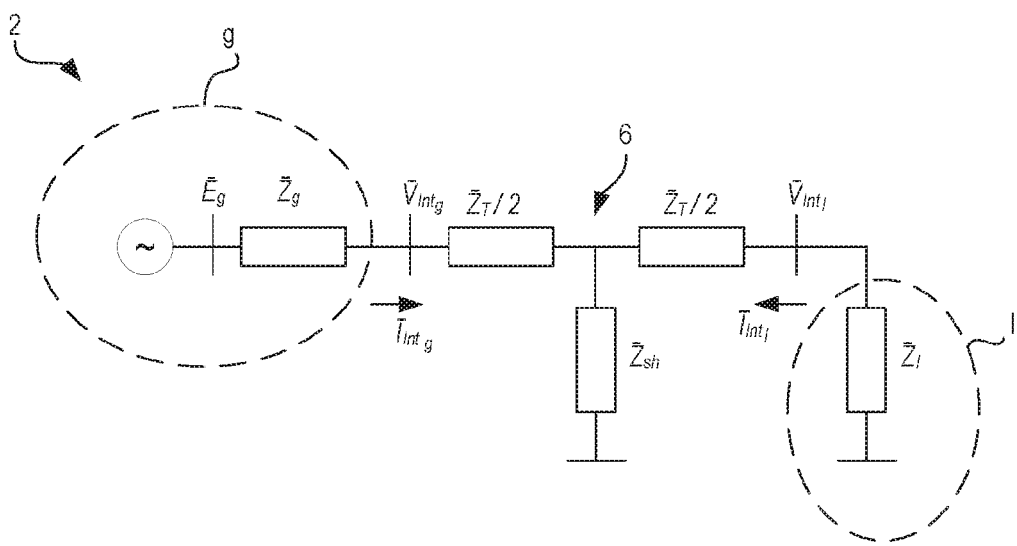
FIG. 6 is a schematic diagram of a power system circuit model which illustrates modeling the transmission corridor as a T-equivalent circuit, according to one or more embodiments.

Regardless of these additional details for tracking the Thevenin equivalent voltage $\overline{E}_g$ and impedance $\overline{Z}_g$ of the power generating part g, the apparatus 8 herein of course computes an index indicating the voltage stability of the corridor 6 as a function of that tracked voltage $\overline{E}_g$ and impedance $\overline{Z}_g$ (Block 130 of FIG. 2). In at least some embodiments, the apparatus 8 computes this index also as a function of the T-equivalent of the corridor 6. FIG. 6 shows an example of such embodiments.

In FIG. 6, the apparatus 8 computes the T-equivalent of the corridor 6 based exclusively on the voltage phasor $\overline{V}_{Int_g}$ and current phasor $\overline{I}_{Int_g}$ at interface $Int_g$ and on the voltage phasor $\overline{V}_{Int_l}$ and current phasor $\overline{I}_{Int_l}$ at interface $Int_l$. Specifically, the apparatus 8 computes the T-equivalent represented in FIG. 6 by the complex impedances $\overline{Z}_T$ and $\overline{Z}_{sh}$ as:

$$\overline{Z}_T = 2\left(\frac{\overline{V}_{Int_g} - \overline{V}_{Int_l}}{\overline{I}_{Int_g} - \overline{I}_{Int_l}}\right) \quad (15)$$

$$\overline{Z}_{sh} = \frac{\overline{V}_{Int_g}\overline{I}_{Int_l} - \overline{V}_{Int_l}\overline{I}_{Int_g}}{(\overline{I}_{Int_l})^2 - (\overline{I}_{Int_g})^2} \quad (16)$$

Note that the apparatus 8 computes the T-equivalent in this way based exclusively on phasor measurements for a current measurement time i, meaning that the computation is advantageously performed without delay.

Figure 7:
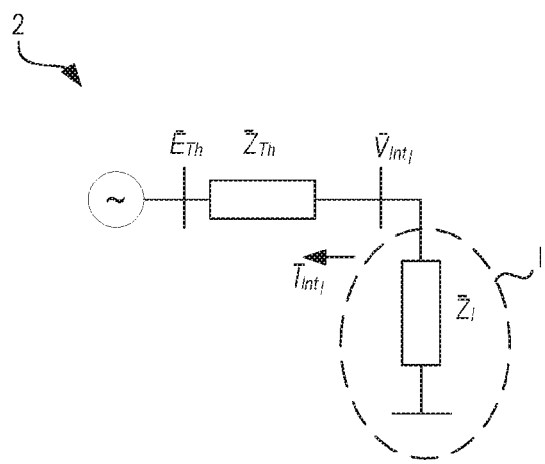
FIG. 7 is a schematic diagram of a power system circuit model which illustrates modeling the combined generation-transmission parts of the system as a Thevenin equivalent circuit, according to one or more embodiments.

Having computed the T-equivalent in this way, the apparatus 8 in these embodiments proceeds by computing the Thevenin equivalent of the combination of the power generating part g and the transmission corridor 6, as shown in FIG. 7. Specifically in this regard, the apparatus 8 computes the Thevenin equivalent impedance $\overline{Z}_{th}$ of the combined generating part g and corridor 6 as:

$$\bar{Z}_{th} = \frac{\bar{Z}_T}{2} + \cfrac{1}{\cfrac{1}{\bar{Z}_{sh}} + \cfrac{2}{\bar{Z}_T + 2\bar{Z}_g}}$$ (17)

The apparatus 6 then computes the Thevenin equivalent voltage $\bar{E}_{th}$ of the combined generating part g and corridor 6 as:

$$\bar{E}_{th} = \bar{V}_{Int_l}\left(\frac{\bar{Z}_{th} + \bar{Z}_l}{\bar{Z}_l}\right)$$ (18)

where the equivalent load impedance $\bar{Z}_l$ of the power receiving (i.e., load) part l is of course:

$$\bar{Z}_l = -\frac{\bar{V}_{Int_l}}{\bar{I}_{Int_l}}$$ (19)

Regardless of the particular technique for calculating the Thevenin equivalent of the combination of the power generating part g and the transmission corridor 6, the apparatus 8 in at least some embodiments uses this Thevenin equivalent in order to express the voltage stability index directly or indirectly in terms of the system's maximum deliverable power. The system's maximum deliverable power in this regard is reached when the magnitude of the Thevenin equivalent impedance $\bar{Z}_{th}$ of the combined generation and transmission parts of the system 2 equals the magnitude of the equivalent load impedance $\bar{Z}_l$ of the power receiving part: $|\bar{Z}_{Th}|=|\bar{Z}_l|$. The apparatus 8 is configured to compute any stability index that exploits this relation, such as a ratio of equivalent and load impedances, and reactive power margin (active, reactive, apparent).

One or more embodiments compute this voltage stability index according to the method of FIG. 2 in order to not only realize the advantages described above but to also more accurately account for structural changes within the transmission corridor 6. Specifically, the apparatus 8 in such embodiments monitors whether a breaker for each line 4 associated with the power generating part interface $Int_g$ is open or closed. The apparatus 8 exploits this breaker monitoring in order to improve its monitoring of the equivalent load impedance $\bar{Z}_s$ at the power generating part interface $Int_g$. The apparatus 8 in this regard dynamically computes $\bar{Z}_s$ exclusively from phasor measurements taken at lines 4 whose breakers are closed.

Where the apparatus 8 computes $\bar{Z}_s$ according to equations (2)-(6), for example, the apparatus 8 excludes from consideration (and effectively "removes" from the corridor 6) transmission lines $c \in Int_g$ that are flagged as having open breakers. In at least some embodiments, the apparatus 8 receives signals indicating the status of line breakers from phasor measurement units deployed for those lines and dynamically flags lines that have open breakers and that therefore should be excluded from the corridor 6. Effectively "re-computing" the structure of the corridor 6 responsive to line breaker status in this way advantageously prevents zero-valued phasor measurements at open lines from introducing inaccuracies in computation of $\bar{Z}_s$ (different with respect to U.S. Pat. No. 7,200,500 B2, April 2007, which is incorporated by reference herein in its entirety).

Figure 8:
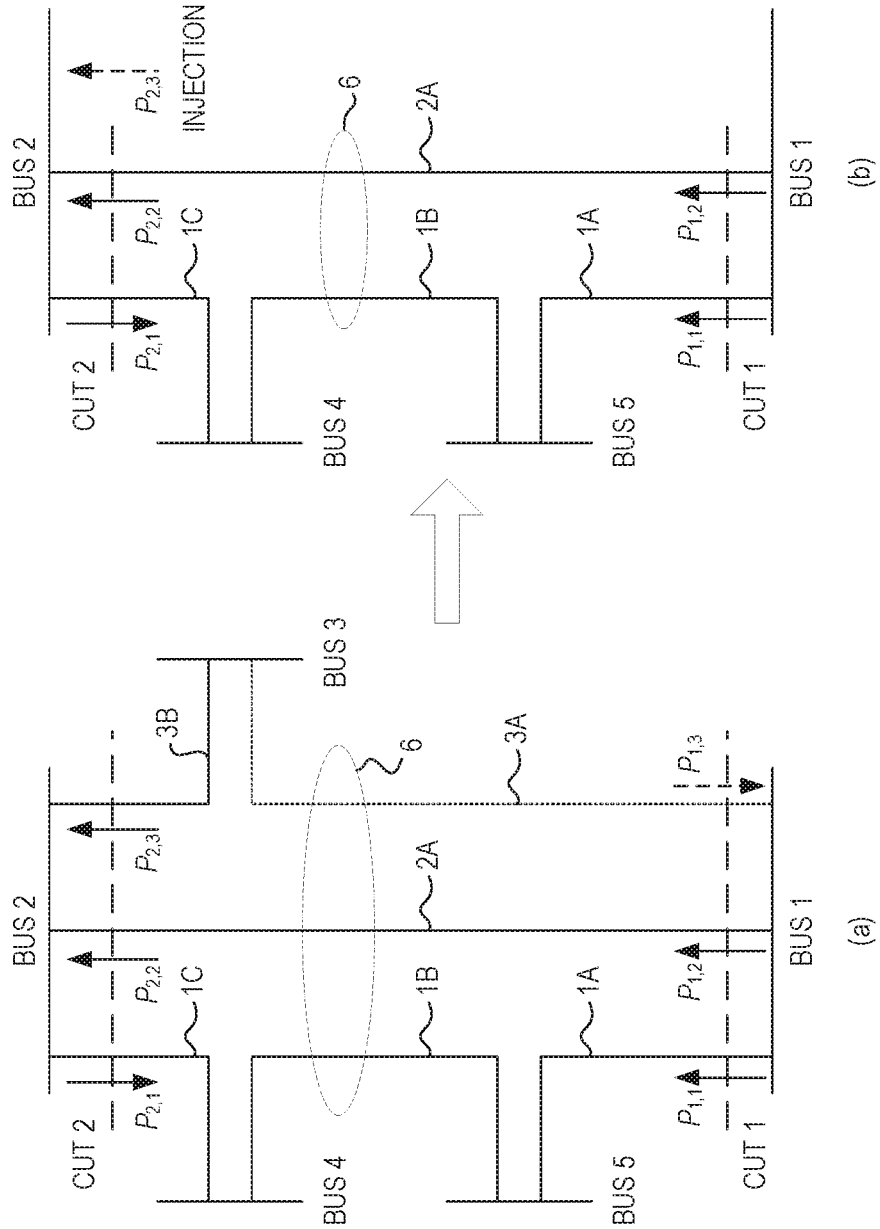
FIG. 8 shows an exemplary transmission corridor for accounting for structural changes within the corridor, according to one or more embodiments.

In one or more embodiments, the apparatus 8 not only accounts for structural changes within the corridor 6 that result in the opening of a whole transmission path, but also that result in the opening of a part of a transmission path. Consider the example shown in FIG. 8.

As shown in FIG. 8(a), the structure of the transmission corridor 6 initially comprises the collection of three transmission paths 1, 2, and 3 extending between virtual cuts 1 and 2 adjacent to physical buses 1 and 2. Transmission path 1 consists of line 1A extending between physical buses 1 and 5, line 1B extending between physical buses 4 and 5, and line 1C extending between physical buses 4 and 2. Transmission path 2 just consists of line 2A extending between physical buses 1 and 2. Finally, transmission path 3 consists of line 3A extending between physical buses 1 and 3, and line 3B extending between physical buses 3 and 2. Responsive to detecting that the breaker status for line 3A has changed from closed to open, the apparatus 8 changes from computing $P_{Int_1}$ as $P_{1,1}+P_{1,2}-P_{1,3}$ to computing $P_{Int_1}$ as $P_{1,1}+P_{1,2}$. As shown in FIG. 8(b), though, the apparatus 8 advantageously recognizes that the breaker status for line 3A changing to open only results in a partial opening of transmission path 3. The apparatus 8 therefore adds the remaining portion of path 3 to bus 2 as injection (here, as a positive injection given the direction of the flow of $P_{2,3}$). This means that the apparatus 8 continues to compute $P_{Int2}$ as $P_{2,1}-P_{2,2}-P_{2,3}$ both before and after detecting the change of the breaker status for line 3A.

Intuitively, a change in the structure of the corridor 6 requires re-initialization of the Thevenin equivalent voltage $\bar{E}_g$. However, one or more embodiments herein refrain from re-initializing the Thevenin equivalent voltage $\bar{E}_g$ in this case and instead rely on updates to the Thevenin equivalent voltage $\bar{E}_g$ to accurately account for the corridor structure changes. Specifically, responsive to detecting the opening or closing of one or more breakers for lines associated with the power generating part interface $Int_g$, the apparatus 8 simply updates the Thevenin equivalent voltage $\bar{E}_g$ to reflect the magnitude of the resulting change in the voltage phasor $\bar{V}_{Int_g}$ at interface $Int_g$, as dynamically computed (to account for the corridor structure changes), without re-initializing the Thevenin equivalent voltage $\bar{E}_g$.

Those skilled in the art will appreciate that the various embodiments described herein are presented as non-limiting examples. For instance, although FIG. 1 illustrates part A of the system 2 as being designated as the power generating part g, those skilled in the art will appreciate that such need not be the case. In fact, the apparatus 8 according to one or more embodiments dynamically adapts which of the parts of the system 2 is designated as the power generating part g. The apparatus 8 does so responsive to detecting a change in the direction or magnitude of power flowing through one or both interfaces between the corridor 6 and the parts of the power system 2. In some embodiments, the apparatus 8 monitors for such a change at every measurement time i.

The apparatus 8 dynamically detects a power flow direction change in one or more embodiments as a function of the aggregated active power at the corridor interfaces. Aggregated active power at an interface in this sense means the algebraic sum of active power over the transmission lines associated with an interface. Consider the example shown in FIG. 9 (different with respect to U.S. Pat. No. 7,200,500 B2, April 2007, which is incorporated by reference herein in its entirety).

Figure 9:
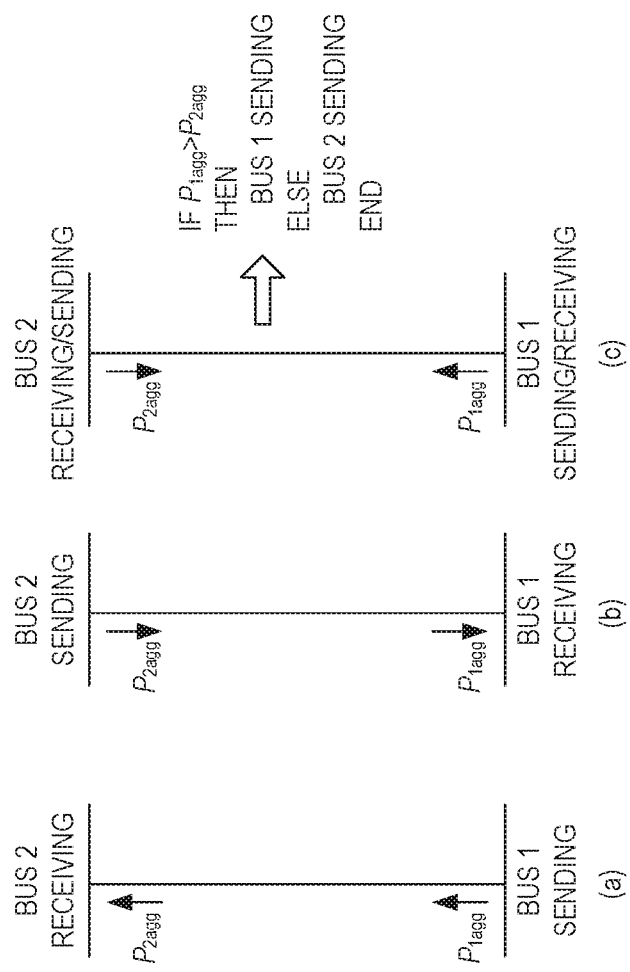
FIG. 9 shows exemplary scenarios for dynamically adapting which part of the power system is designated as the power generating part as a function of aggregate active power, according to one or more embodiments.

As shown in FIG. 9(a), the apparatus 8 designates virtual bus 1 as the power generating part interface $Int_g$ responsive to detecting that the aggregated active power $P_{1_{agg}}$ at virtual bus 1 is positive and the aggregated active power $P_{2_{agg}}$ at virtual bus 2 is negative (where positive active power indicates power flow out of the bus and negative active power indicates power flow into the bus, as is conventional). Conversely, as shown in FIG. 9(*b*), the apparatus 8 designates virtual bus 2 as the power generating part interface $Int_g$ responsive to detecting that the aggregated active power $P_{2_{agg}}$ at virtual bus 2 is positive and the aggregated active power $P_{1_{agg}}$ at virtual bus 1 is negative. Finally, as shown in FIG. 9(*c*), the apparatus designates whichever virtual bus 1 or 2 has the larger aggregated active power $P_{1_{agg}}$ or $P_{2_{agg}}$ responsive to detecting that both the aggregated active power $P_{1_{agg}}$ and $P_{2_{agg}}$ at buses 1 and 2 are positive. In some embodiments, though, the apparatus 8 proceeds as shown in FIG. 9(*c*) only upon validating the positive polarity of both aggregated active powers. Specifically, the apparatus validates that the phasor measurements used for computing the aggregated active powers were not performed over a short duration caused by fault conditions, as opposed to multi-terminal corridors with tapped configuration.

Of course, although the above embodiments have been described with reference to the direction and/or magnitude of active power flow, the embodiments apply equally to the direction and/or magnitude of reactive power flow. In fact, in at least some embodiments, the direction of active power flow and the direction of reactive power flow are assumed to be the same.

Regardless, dynamically adapting the power generating part designation in this way advantageously generalizes voltage stability index computation for application to a wide range of power system and transmission corridor types. For instance, in some embodiments the power system 2 comprises an interconnected transmission system where the power flow direction changes based on a series of operational decisions, such as market rules, the schedule of power flow, and the demand-supply chain process. Of course, embodiments are also applicable to a radial system, where power statically flows from one part to another part of the system, but in such cases there is no requirement that one part be preselected as the power generating part. Rather, changes in power flow direction are handled through a series of recursive validation of aggregated active powers at both ends of the corridor 6.

In one or more embodiments, the apparatus 8 re-initializes the Thevenin equivalent voltage $E_g$ responsive to dynamically adapting which part of the system 2 is designated as the power generating part g. This requires a certain number of measurement samples to be used for Thevenin equivalent voltage identification.

Figure 10A:
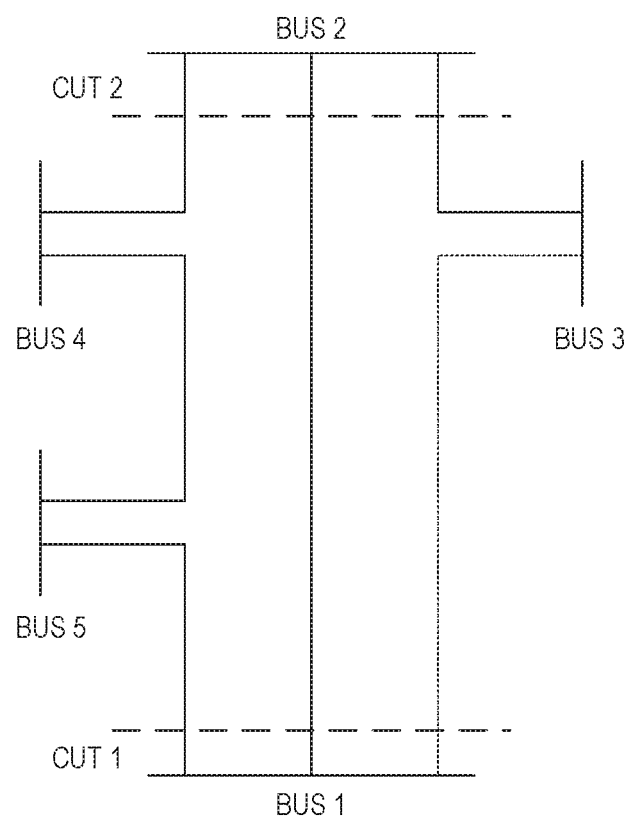
FIG. 10A illustrates an exemplary corridor.
Figure 10B:
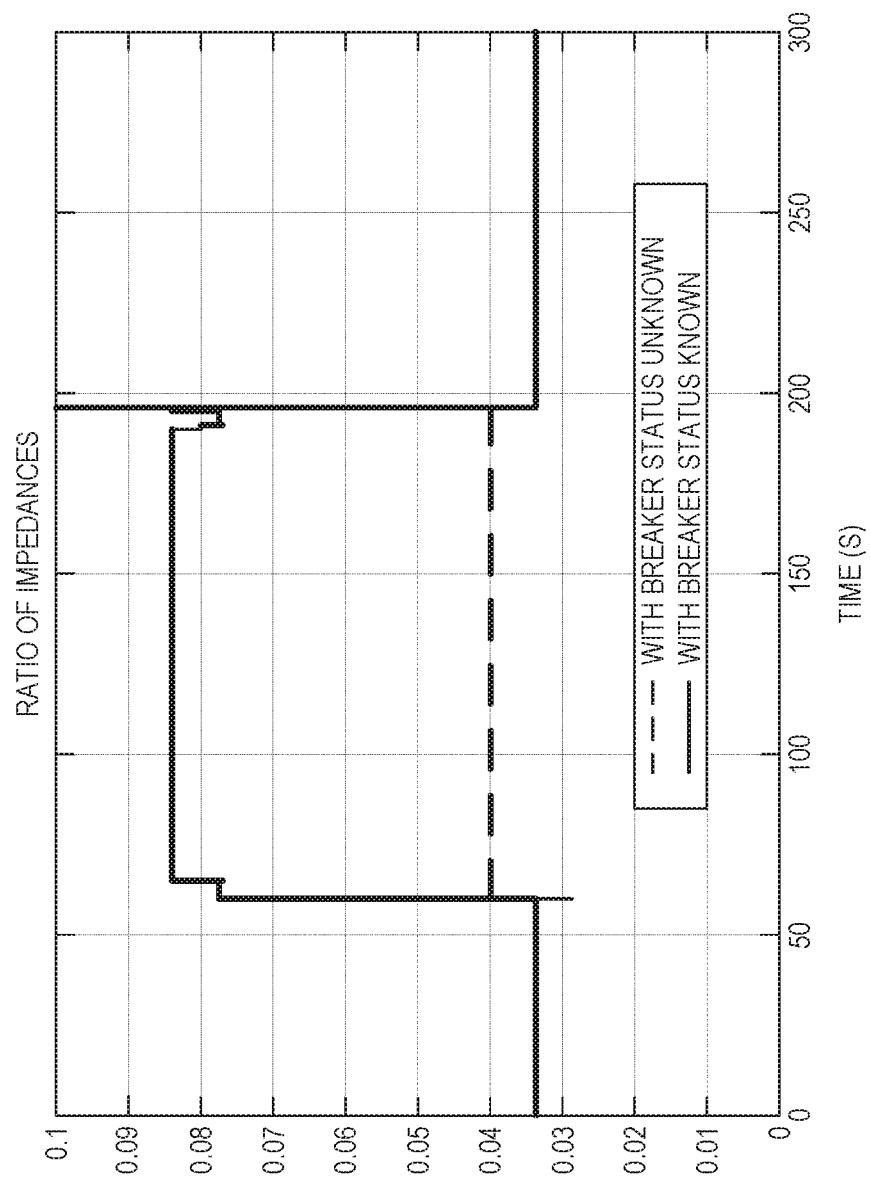
FIGS. 10B-C illustrate quantitative advantages of accounting for structural changes within the exemplary corridor of FIG. 10A, according to one or more embodiments, with FIG. 10B illustrating these advantages in terms of a ratio of impedance and FIG. 10C illustrating the advantages in terms of reactive power margin.
Figure 10C:
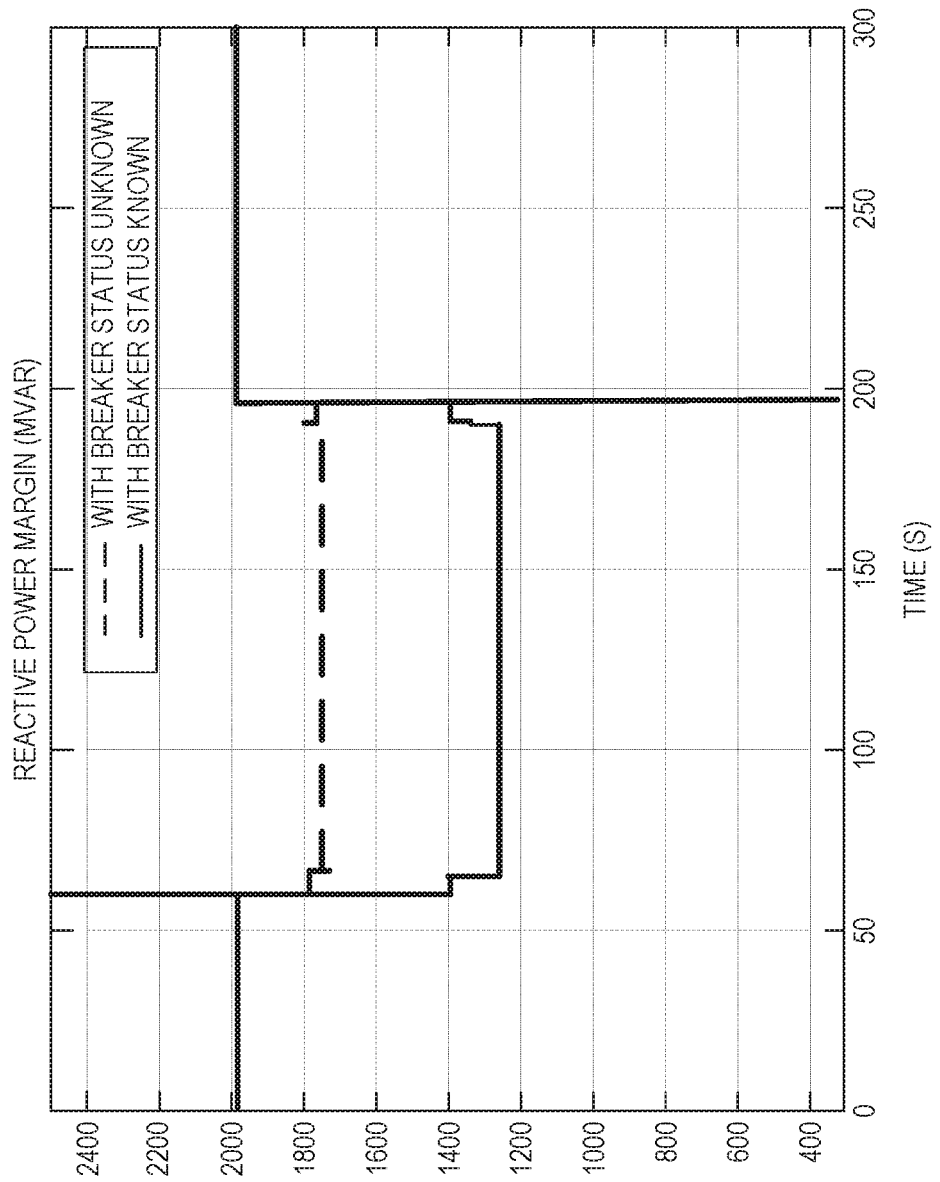

Advantages of improvements in voltage stability monitoring of transmission corridors introduced by one or more embodiments herein are illustrated using phasor measurement units recordings for the exemplary corridor shown in FIG. 10A. Synchronized phasor measurements in this example are collected at the rate of 60 samples/second. The exemplary corridor shown in FIG. 10A includes a line outage between buses 1 and 3 at time t=60 seconds, with the same line re-closed at time t=192 seconds. Advantages are illustrated in terms of two voltage stability indices derived from the concept of Thevenin equivalent: ratio of equivalent and load impedances, as shown in FIG. 10B, and reactive power margin, as shown in FIG. 10C. Time evolutions of these two indices, with and without detection and incorporation of structural change within the corridor, are given in FIGS. 10B and 10C. If the opened line is considered as part of the monitored corridor with measurement equal to zero (i.e., breaker status unknown), it produces errors in corridor stability conditions computation of approximately 0.3 in ratio of impedances and 400 Mvars in reactive power margin as compared to the case when the opened line, together with its counterpart line at Cut 2, is taken out from the consideration in the algorithm (breaker status known).

Figure 11A:
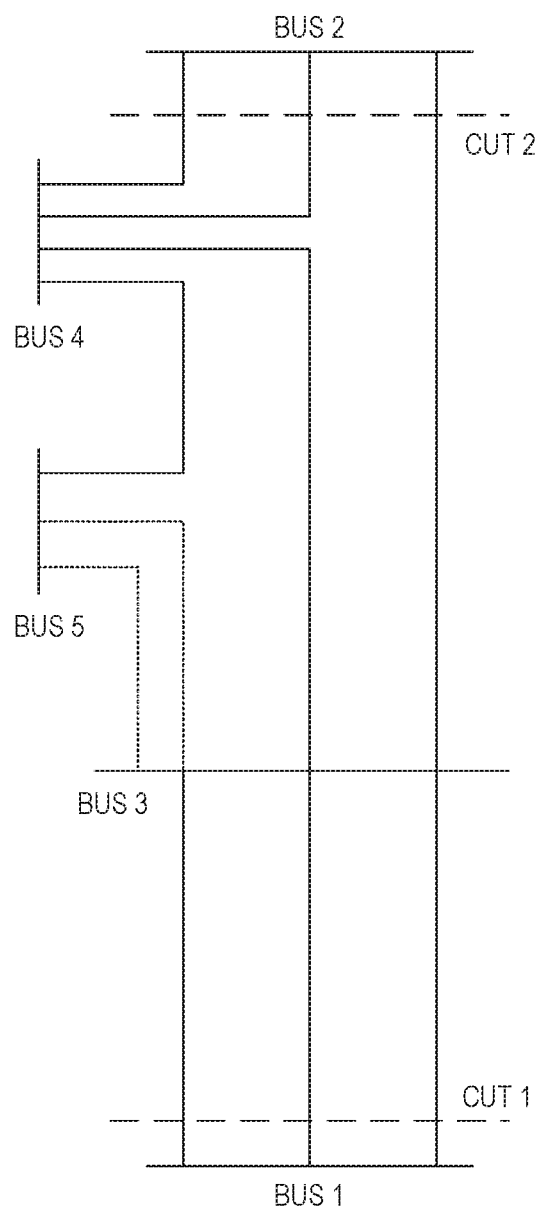
FIG. 11A illustrates a different exemplary corridor.
Figure 11B:
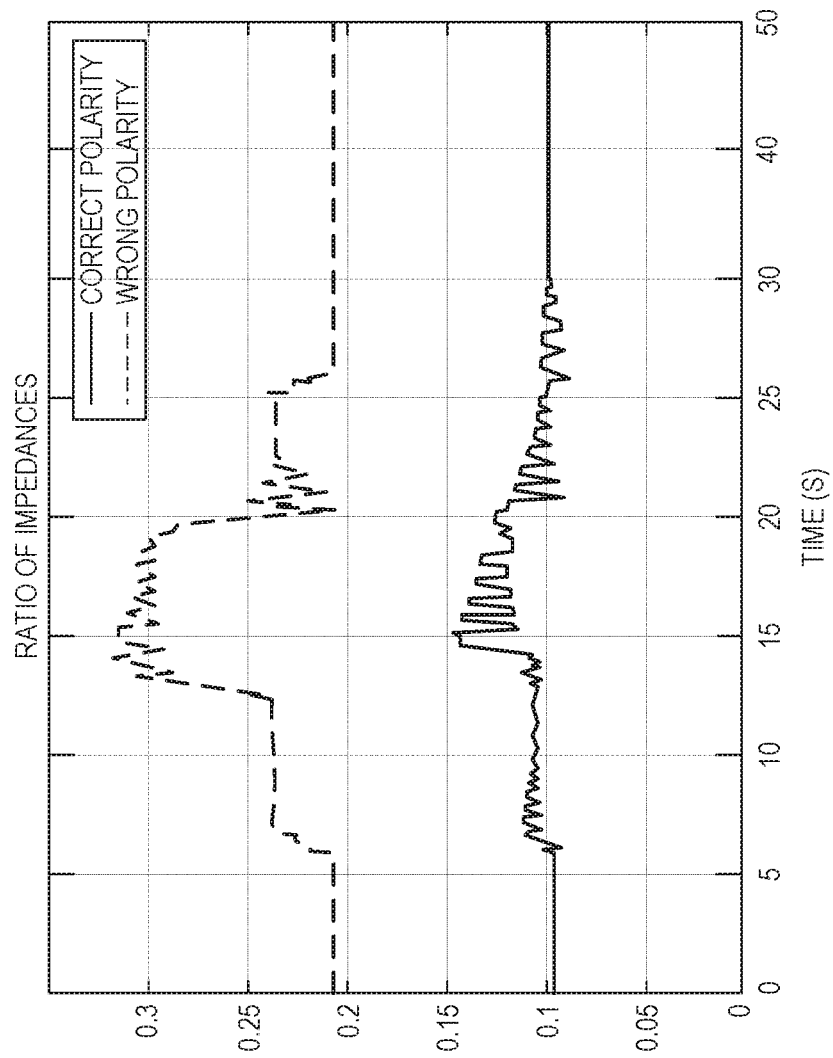
FIGS. 11B-C illustrate quantitative advantages of dynamically adapting which part of the exemplary corridor of FIG. 11A is designated as the power generating part, according to one or more embodiments, with FIG. 11B illustrating these advantages in terms of a ratio of impedance and FIG. 11C illustrating the advantages in terms of reactive power margin.
Figure 11C:
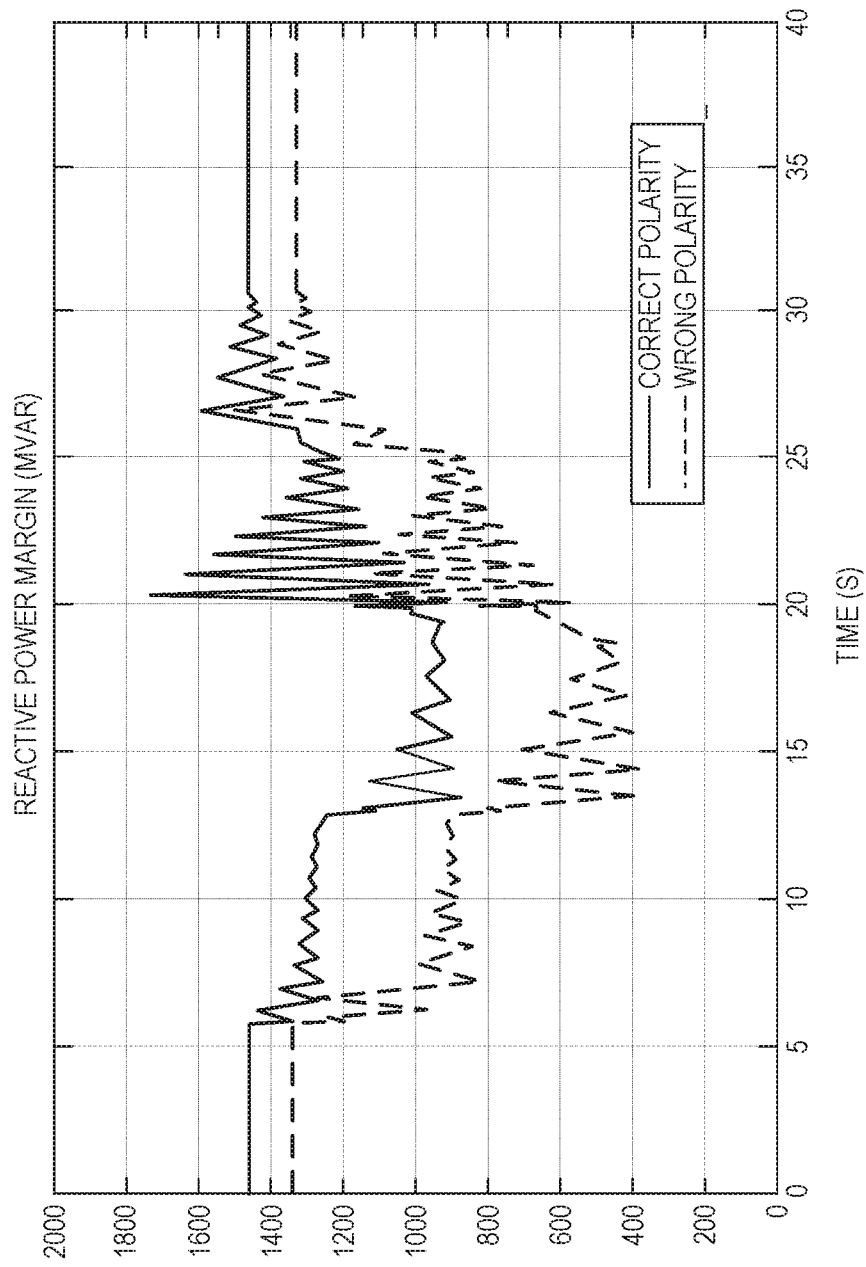

A more complicated corridor is shown in FIGS. 11A-C as another example, to demonstrate the advantages of dynamically adapting which part of the power system is designated as the power generating part. This case includes consecutive outages of two lines at t=7 second and t=13 seconds, followed by reclosing the lines in opposite order of outages at t=20 seconds and t=25 seconds. Within the monitored corridor, these changes do not present structural changes, since they are not directly related to defined cuts of the corridor. Aggregated active powers on the cuts are such that both are directed toward the corridor, with the power at Cut 1 having the bigger value and therefore Bus 1 being designated as the power generating part. Computations introduced by one or more embodiments herein shown as being performed with correct (Bus 1 as power generating part) and wrong (Bus 2 intentionally set as power generating part) polarity. Time evolutions of two major voltage stability indices are given in FIG. 11B (ratio of impedances) and FIG. 11C (reactive power margin). Wrong polarity results in considerable error: approximately 0.1 in ratio of impedances and 500 Mvars (biggest error) in reactive power margin.

In view of the above, one or more embodiments herein have advantages over U.S. Pat. No. 7,200,500 B2. First, the generation area (sending end) Thevenin equivalent is identified using a specific procedure; it is not assumed as having very strong network on sending and assuming small value for its equivalent impedance that is never updated later. This offers the possibility to reflect changes in the sending area (e.g. some generator hitting the limit, switching on/off capacitor, etc.), which is not possible with the solution in the '500 patent. Second, one or more embodiments herein detect and handle changes within the corridor. In the '500 patent this is not possible and it could lead to wrong assessment of stability conditions. The '500 patent works only if the flow is from sending to receiving and fixed structure of the corridor. This feature extends embodiments herein to a much wider number of possible corridors. Third, one or more embodiments detect changes in polarity (flow direction) and change the position of the sending and receiving ends. This is contrasted, again, with the '500 patent, which works only for one flow direction for both active and reactive powers) for sending to receiving.

Those skilled in the art will appreciate that the one or more "circuits" described herein may refer to a combination of analog and digital circuits, and/or one or more processors configured with software stored in memory and/or firmware stored in memory that, when executed by the one or more processors, perform as described herein. One or more of these processors, as well as the other digital hardware, may be included in a single application-specific integrated circuit (ASIC), or several processors and various digital hardware may be distributed among several separate components, whether individually packaged or assembled into a system-on-a-chip (SoC).

Thus, those skilled in the art will recognize that the present invention may be carried out in other ways than those specifically set forth herein without departing from essential characteristics of the invention. The present embodiments are thus to be considered in all respects as illustrative and not restrictive, and all changes coming within the meaning and equivalency range of the appended claims are intended to be embraced therein.

What is claimed is:

1. A method of monitoring voltage stability of a transmission corridor through which power flows between different parts of a power system, the method comprising the following performed by a voltage stability monitoring apparatus:
   monitoring an equivalent load impedance at an interface between the transmission corridor and a part of the power system designated as generating said power, the equivalent load impedance at said interface comprising a ratio of a voltage phasor at said interface to a current phasor at said interface;
   tracking a Thevenin equivalent voltage and impedance of said designated part by separately updating that voltage and impedance, wherein updating the Thevenin equivalent voltage comprises updating the imaginary part of the voltage to reflect the magnitude of any changes in said voltage phasor that are associated with large variations in the magnitude of the equivalent load impedance at said interface, said large variations including variations greater than a threshold-defined variation;
   computing an index indicating said voltage stability as a function of the tracked Thevenin equivalent voltage and impedance; and
   performing one or more actions, based on the computed index, as needed to control the transmission corridor's voltage stability and/or mitigate system degradation or disturbance propagation.

2. The method of claim 1, wherein updating the Thevenin equivalent voltage further comprises setting the real part of the voltage to said voltage phasor for a current phasor measurement time.

3. The method of claim 1, wherein said updating the Thevenin equivalent voltage comprises, for each of a plurality of phasor measurement times, determining whether or not variation in the magnitude of the equivalent load impedance at said interface since a previous phasor measurement time is greater than the threshold-defined variation, and, if so, adjusting the imaginary part of the Thevenin equivalent voltage computed for the previous phasor measurement time by the magnitude of the change in said voltage phasor since that previous phasor measurement time.

4. The method of claim 1, wherein updating the Thevenin equivalent impedance comprises solving a set of two linear equations with two unknown variables that comprise the real and imaginary parts of the Thevenin equivalent impedance, wherein known variables in the set of two linear equations include the imaginary part of the Thevenin equivalent voltage as updated to reflect the magnitude of any changes in said voltage phasor and the real part of the Thevenin equivalent voltage as set to said voltage phasor for a current phasor measurement time.

5. The method of claim 1, further comprising dynamically adjusting a threshold defining the threshold-defined variation, as a function of the Thevenin equivalent voltage.

6. The method of claim 1, further comprising dynamically adapting which of said parts of the power system is designated as generating said power, responsive to detecting a change in direction or magnitude of power flowing through one or both interfaces between the transmission corridor and said parts of the power system.

7. The method of claim 1, further comprising monitoring whether a breaker for each line associated with said interface is open or closed, and wherein monitoring the equivalent load impedance at said interface comprises dynamically computing the equivalent load impedance at said interface exclusively from phasor measurements taken at lines whose breakers are closed.

8. The method of claim 7, wherein, responsive to detecting the opening or closing of one or more of said breakers, said updating comprises updating the imaginary part of the Thevenin equivalent voltage to reflect the magnitude of the resulting change in said voltage phasor, as dynamically computed, without re-initializing the imaginary part of the Thevenin equivalent voltage.

9. The method of claim 1, wherein updating the Thevenin equivalent voltage further comprises, responsive to small variations in the magnitude of the equivalent load impedance at said interface, decreasing or increasing the imaginary part of the Thevenin equivalent voltage by a predefined percentage change when said small variations do or do not have the same polarity as estimated variations in said Thevenin equivalent impedance, respectively, said small variations including variations less than the threshold-defined variation.

10. The method of claim 9, wherein, responsive to small variations in the magnitude of the equivalent load impedance at said interface, increasing the imaginary part of the Thevenin equivalent voltage comprises computing the imaginary part of the Thevenin equivalent voltage as $E_{g,I}^i = E_{g,I}^{i-1}(1+|E_{g,I}^{i-1} \times k|)$ and decreasing the imaginary part of the Thevenin equivalent voltage comprises computing the imaginary part of the Thevenin equivalent voltage as $E_{g,I}^i = E_{g,I}^{i-1}(1-|E_{g,I}^{i-1} \times k|)$, where $E_{g,I}^i$ is the imaginary part of the Thevenin equivalent voltage for a current phasor measurement time i, $E_{g,I}^{i-1}$ is the imaginary part of the Thevenin equivalent voltage for a previous phasor measurement time i−1, and k is a pre-specified parameter configured to constrain tracking error within predefined bounds, and wherein updating the Thevenin equivalent voltage further comprises setting the real part of the Thevenin equivalent voltage $E_{g,R}^i$ for the current phasor measurement time i as $E_{g,R}^i = V_{Int_g^i}$.

11. The method of claim 10, wherein, responsive to small variations in the magnitude of the equivalent load impedance at said interface, increasing the imaginary part of the Thevenin equivalent voltage comprises unconditionally computing the imaginary part of Thevenin equivalent voltage as $E_{g,I}^i = E_{g,I}^{i-1}(1+|E_{g,I}^{i-1} \times k|)$ and decreasing the imaginary part of the Thevenin equivalent voltage comprises unconditionally computing the imaginary part of the Thevenin equivalent voltage as $E_{g,I}^i = E_{g,I}^{i-1}(1-|E_{g,I}^{i-1} \times k|)$.

12. The method of claim 1, wherein said performing comprises automatically performing a prescribed action based on the computed index.

13. The method of claim 1, wherein said performing comprises displaying the computed index.

14. A voltage stability monitoring apparatus configured to monitor voltage stability of a transmission corridor through which power flows between different parts of a power system, the voltage stability monitoring apparatus comprising one or more processing circuits configured to:
   monitor an equivalent load impedance at an interface between the transmission corridor and a part of the power system designated as generating said power, the equivalent load impedance at said interface comprising a ratio of a voltage phasor at said interface to a current phasor at said interface;
   track a Thevenin equivalent voltage and impedance of said designated part by separately updating that voltage and impedance, wherein updating the Thevenin equivalent voltage comprises updating imaginary part of the voltage to reflect the magnitude of any changes in said voltage phasor that are associated with large variations in the magnitude of the equivalent load impedance at said interface, said large variations including variations greater than a threshold-defined variation;

compute an index indicating said voltage stability as a function of the tracked Thevenin equivalent voltage and impedance; and perform one or more actions, based on the computed index, as needed to control the transmission corridor's voltage stability and/or mitigate system degradation or disturbance propagation.

15. The voltage stability monitoring apparatus of claim 14, wherein the one or more processing circuits are configured to update the Thevenin equivalent voltage further by setting the real part of the voltage to said voltage phasor for a current phasor measurement time.

16. The voltage stability monitoring apparatus of claim 14, wherein the one or more processing circuits are configured to update the Thevenin equivalent voltage by, for each of a plurality of phasor measurement times, determining whether or not variation in the magnitude of the equivalent load impedance at said interface since a previous phasor measurement time is greater than the threshold-defined variation, and, if so, adjusting the imaginary part of the Thevenin equivalent voltage computed for the previous phasor measurement time by the magnitude of the change in said voltage phasor since that previous phasor measurement time.

17. The voltage stability monitoring apparatus of claim 14, wherein the one or more processing circuits are configured to update the Thevenin equivalent impedance by solving a set of two linear equations with two unknown variables that comprise the real and imaginary parts of the Thevenin equivalent impedance, wherein known variables in the set of two linear equations include the imaginary part of the Thevenin equivalent voltage as updated to reflect the magnitude of any changes in said voltage phasor and the real part of the Thevenin equivalent voltage as set to said voltage phasor for a current phasor measurement time.

18. The voltage stability monitoring apparatus of claim 14, wherein the one or more processing circuits are further configured to dynamically adjust a threshold associated with the threshold-defined variation as a function of the Thevenin equivalent voltage.

19. The voltage stability monitoring apparatus of claim 14, wherein the one or more processing circuits are further configured to dynamically adapt which of said parts of the power system is designated as generating said power, responsive to detecting a change in direction or magnitude of power flowing through one or both interfaces between the transmission corridor and said parts of the power system.

20. The voltage stability monitoring apparatus of claim 14, wherein the one or more processing circuits are further configured to monitor whether a breaker for each line associated with said interface is open or closed, and are configured to monitor the equivalent load impedance at said interface by dynamically computing the equivalent load impedance at said interface exclusively from phasor measurements taken at lines whose breakers are closed.

21. The voltage stability monitoring apparatus of claim 20, wherein the one or more processing circuits are configured, responsive to detecting the opening or closing of one or more of said breakers, to update the imaginary part of the Thevenin equivalent voltage to reflect the magnitude of the resulting change in said voltage phasor, as dynamically computed, without re-initializing the imaginary part of the Thevenin equivalent voltage.

22. The voltage stability monitoring apparatus of claim 14, wherein the one or more processing circuits are configured to update the Thevenin equivalent voltage also by, responsive to small variations in the magnitude of the equivalent load impedance at said interface, decreasing or increasing the imaginary part of Thevenin equivalent voltage by a predefined percentage change when said small variations do or do not have the same polarity as estimated variations in said Thevenin equivalent impedance, respectively, said small variations including variations less than the threshold-defined variation.

23. The voltage stability monitoring apparatus of claim 22, wherein the one or more processing circuits are configured, responsive to small variations in the magnitude of the equivalent load impedance at said interface, to increase the imaginary part of the Thevenin equivalent voltage as $E_{g,I}^{i}=E_{g,I}^{i-1}(1+|E_{g,I}^{i-1}\times k|)$ and decrease the imaginary part of the Thevenin equivalent voltage as $E_{g,I}^{i}=E_{g,I}^{i-1}(1-|E_{g,I}^{i-1}\times k|)$, where $E_{g,I}^{i}$ is the imaginary part of the Thevenin equivalent voltage for a current phasor measurement time i, $E_{g,I}^{i-1}$ is the imaginary part of the Thevenin equivalent voltage for a previous phasor measurement time i−1, and k is a pre-specified parameter configured to constrain tracking error within predefined bounds, and to set the real part of the Thevenin equivalent voltage $E_{g,R}^{i}$ for the current phasor measurement time i as $E_{g,R}^{i}=V_{Int_g}^{i}$.

24. The voltage stability monitoring apparatus of claim 23, wherein the one or more processing circuits are configured, responsive to small variations in the magnitude of the equivalent load impedance at said interface, to increase the imaginary part of the Thevenin equivalent voltage by unconditionally computing the imaginary part of the Thevenin equivalent voltage as $E_{g,I}^{i}=E_{g,I}^{i-1}(1+|E_{g,I}^{i-1}\times k|)$ and to decrease the imaginary part of the Thevenin equivalent voltage by unconditionally computing the Thevenin equivalent voltage as $E_{g,I}^{i}=E_{g,I}^{i-1}(1-|E_{g,I}^{i-1}\times k|)$.

25. The voltage stability monitoring apparatus of claim 14, wherein the one or more processing circuits are configured to automatically perform a prescribed action based on the computed index.

26. The voltage stability monitoring apparatus of claim 14, wherein the one or more processing circuits are configured to display the computed index.

* * * * *